(12) United States Patent
Kato

(10) Patent No.: US 7,627,773 B2
(45) Date of Patent: *Dec. 1, 2009

(54) LOGIC CIRCUIT AND SEMICONDUCTOR INTEGRATED CIRCUIT

(75) Inventor: Kiyoshi Kato, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 442 days.

This patent is subject to a terminal disclaimer.

(21) Appl. No.: 11/509,606

(22) Filed: Aug. 25, 2006

(65) Prior Publication Data

US 2006/0284650 A1 Dec. 21, 2006

Related U.S. Application Data

(62) Division of application No. 10/897,037, filed on Jul. 23, 2004, now Pat. No. 7,098,696.

(30) Foreign Application Priority Data

Jul. 31, 2003 (JP) ............................. 2003-284307

(51) Int. Cl.
*G06F 1/00* (2006.01)
*G06F 1/12* (2006.01)
*H03L 7/06* (2006.01)
*H03K 19/00* (2006.01)
*H03K 17/80* (2006.01)

(52) U.S. Cl. .................. 713/500; 713/400; 327/149; 326/93; 307/409

(58) Field of Classification Search ................ 713/500, 713/400; 327/149; 326/93; 307/409
See application file for complete search history.

(56) References Cited

U.S. PATENT DOCUMENTS 5,306,963 A 4/1994 Leak et al.

(Continued)

FOREIGN PATENT DOCUMENTS

EP 1 056 069 11/2000

(Continued)

OTHER PUBLICATIONS

Office Action (Application No. 200410068498.1) Dated Mar. 7, 2008.

*Primary Examiner*—Chun Cao
*Assistant Examiner*—Stefan Stoynov
(74) *Attorney, Agent, or Firm*—Eric J. Robinson; Robinson Intellectual Property Law Office, P.C.

(57) ABSTRACT

The invention provides a logic circuit to identify time difference between signals having a variation in delay, and an integrated circuit which can evaluate variations in delay among internal signals. By using a logic circuit which outputs different number of pulse depending on a relationship of delay when a first signal and a second signal which are a pair of digital signals having a time difference are inputted, variations in delay of internal signals of an integrated circuit can be evaluated. Specifically, an output signal is generated by a logical operation of values of the first signal and second signal in a period in which the first signal is High and the second signal is Low, and values of a first signal and a second signal immediately before them by using a latch circuit. Further, by using a delay circuit which can set a delay time of an input signal, time difference between signals can be evaluated quantitatively.

24 Claims, 14 Drawing Sheets

U.S. PATENT DOCUMENTS

| | | |
|---|---|---|
| 5,406,198 A | 4/1995 | Orihashi et al. |
| 5,438,259 A | 8/1995 | Orihashi et al. |
| 5,495,188 A | 2/1996 | Chen et al. |
| 5,523,984 A * | 6/1996 | Sato et al. .................... 368/46 |
| 5,842,001 A | 11/1998 | Kubota |
| 6,622,255 B1 * | 9/2003 | Kurd et al. ................. 713/503 |
| 6,741,668 B1 * | 5/2004 | Nakamura ................. 375/376 |
| 6,774,679 B2 * | 8/2004 | Nogami ........................ 327/3 |
| 6,903,991 B2 | 6/2005 | Mullarkey et al. |
| 6,909,417 B2 | 6/2005 | Washio et al. |
| 2003/0137330 A1 | 7/2003 | Yazawa et al. |
| 2005/0062512 A1 | 3/2005 | Kato |

FOREIGN PATENT DOCUMENTS

| | | |
|---|---|---|
| JP | 05-007127 | 1/1993 |
| JP | 06-112782 | 4/1994 |
| JP | 10-145350 | 5/1998 |
| JP | 2000-187533 | 7/2000 |
| JP | 2002-084170 | 3/2002 |
| JP | 2003-216271 | 7/2003 |

* cited by examiner

LOGIC CIRCUIT AND SEMICONDUCTOR INTEGRATED CIRCUIT

BACKGROUND OF THE INVENTION

1. Field of the Invention

The present invention relates to a logic circuit which evaluates a delay relationship and a delay time among digital signals.

2. Description of the Related Art

In recent years, an integrated circuit formed over a single crystalline silicon substrate is showing a remarkable progress in its scale and frequency. In such a logic circuit, it is important that variations in delay of clock signals and the like are controlled since frequency characteristics decrease in accordance with more variations, which may cause a malfunction in some cases. Therefore, in the conventional design, an integrated circuit is divided into regions so that the variations in delay are not a problem, and a variation in delay between signals inputted to each region is accurately estimated by simulation.

Further, a technology to form a thin film transistor (hereinafter referred to as a TFT) over a glass substrate is being improved and a technology to form an integrated circuit over a glass substrate is actively developed these years. The TFTs, however, have more variations in characteristics and occupy more area as compared to a transistor formed over a single crystalline silicon substrate. As these characteristics cause to increase the variations in delay among signals, it is a problem of an integrated circuit formed on a glass substrate that it is difficult to improve operation speed and yield. In such an integrated circuit, it is more vital to accurately estimate delay time of a clock signal and the like.

SUMMARY OF THE INVENTION

These and other objects, features and advantages of the present invention will become more apparent upon reading of the following detailed description along with the accompanied drawings.

In order to accurately estimate a delay time in an integrated circuit in the design phase, it is important to match characteristics of each transistor, a delay time of a logic gate, a wiring delay time and the like between the actual measurement and simulation. The actual measurement is generally evaluated by using a TEG (Test Elementary Group) formed by a single transistor, a logic gate and the like.

However, the variations in delay which are a problem in an integrated circuit are caused by the sum of the delay time of a number of logic gates and wirings. Therefore, matching each gate level only is not enough in many cases.

As a measure for the aforementioned problem, it is efficient to perform verification on a chip-by-chip basis. That is, by performing verification on a chip-by-chip basis, actual internal signals including the delay time of logic gates and wirings can be used for matching. Therefore, the efficiency and accuracy of matching can be improved.

Conventionally, however, verification on a chip-by-chip basis was not performed sufficiently. This is because it is difficult to measure the variations in delay of internal signals of a chip with high accuracy.

As a method for measuring delay of internal signals, there is a method to provide an electrode pad at a location to be measured and measure with a prober directly. However, it is hard to perform an accurate evaluation because of the difficulty due to multi-layer wirings and fineness, and additional uncertain factors such as a parasitic capacitance, a parasitic resistance and a noise that are dependent on the measurement environment. Therefore, it is preferable to incorporate some dedicated circuit for evaluation, however, what is difficult is to evaluate a delay time of which time scale is far shorter than a base clock of an integrated circuit. This is the context in which verification on a chip-by-chip bases was not sufficiently performed conventionally.

The invention is made in view of the aforementioned problems. The invention provides a circuit to evaluate a delay time which is shorter than a base clock. Further, by incorporating such a circuit, an integrated circuit which is capable of evaluating variations in delay of internal signals of the actual integrated circuit can be provided. Consequently, matching of simulation can be verified on a chip-by-chip basis and a characteristic of an integrated circuit can be improved by the improvement in design techniques.

In many cases, an integrated circuit transfers data between registers in accordance with a single clock (referred to as a base clock). In this case, the shortest time scale that can be identified by a logic circuit is the shortest period in which a digital signal holds a value, which is typically a pulse width (half cycle) of the base clock. A logic-circuit of the invention has a following function in order to identify the variations in delay of shorter time scale.

According to a delay identifying circuit of the invention, a first signal and a second signal which are a pair of digital signals having a time difference are inputted and a digital signal having a different number of pulse is outputted between in the case where the first signal is delayed than the second signal and in the case where the second signal is delayed than the first signal.

Further, the invention is also efficient in the case where the time difference is equal to or shorter than a period in which the first signal or the second signal holds a value.

Further, the invention is also efficient in the case where the time difference is equal to or shorter than a half cycle of a clock signal when an input signal synchronizes a clock signal.

That is to say, according to the invention, a fine delay time is identified by a digital signal output, specifically by the number of pulse of the output signal.

Such functions of the delay identifying circuit are described with reference to FIGS. 1A, 1B, 1C, 1D, and 1E. FIG. 1A is a block diagram of a delay identifying circuit 101 having input signals in1, in2, and an output signal out. FIGS. 1B and 1C are diagrams showing the functions of the delay identifying circuit 101, describing how the output signal out appears when the input signals in1 and in2 are pulse signals. That is, the delay identifying circuit 101 outputs a pulse when the input signal in2 is delayed than the input signal in1, and does not output a pulse when the input signal in1 is delayed than the input signal in2. Similarly, when the input signals in1 and in2 are clock signals, the output signal out of the delay identifying circuit 101 appears as shown in FIGS. 1D and 1E.

In FIG. 1E, for example, the input signal in1 is delayed than the input signal in2 by a positive period, which is shown as a period 102.

According to another mode of the delay identifying circuit of the invention as shown in FIGS. 1D and 1E, in the case where the first signal is delayed than the second signal, a digital signal having as many number of pulses as the first signal or second signal does, while in the case where the second signal is delayed than the first signal, a digital signal with no pulse is outputted.

It is needless to say that the aforementioned delay relationship of the input signals can be switched. According to another mode of the delay identifying circuit of the invention, in the case where the second signal is delayed than the first signal, a digital signal having as many number of pulses as the first signal or second signal does, while in the case where the first signal is delayed than the second signal, a digital signal with no pulse is outputted.

By using such a circuit, it can be identified which delay of the input signal in1 or in2 is larger than the other.

Next, a circuit configuration of the delay identifying circuit is described. The delay identifying circuit of the invention uses a memory circuit which is not in synchronization with the base clock, typically a latch circuit in order to identify fine delay time among signals. The features are described below.

According to the delay identifying circuit of the invention, either in a period in which the first signal is Low and the second signal is High, or a period in which the first signal is Low and the second signal is High, a digital output signal is generated by a logical operation using at least the first signal and the second signal during the period and a first signal and a second signal immediately before the period.

The delay identifying circuit of the invention comprises a first logic circuit including a memory circuit (typically a latch circuit) which is in a holding state either in a period in which the first signal is Low and the second signal is High, or a period in which the first signal is High and the second signal is Low, and a second logic circuit which is inputted with the first signal, the second signal, and an output signal of the first logic circuit and generates a digital output signal.

That is, the memory circuit is provided for storing data immediately before either a period in which the first signal is Low and the second signal is High, or a period in which the first signal is High and the second signal is Low.

FIG. 2A is a block circuit diagram of the delay identifying circuit of the invention. In FIG. 2A, a delay identifying circuit 203 comprises a logic circuit 201 including a latch circuit and a logic circuit 202, which is inputted with signals in1 and in2 and outputs a signal out.

For example, in order to implement the functions shown in FIGS. 2B and 2C, it is preferable that High is outputted only in a period in which the signals in1 and in2 are Low and High respectively, and signals in1 and in2 immediately before them are both Low. As a result, timing charts shown in FIGS. 2B and 2C can be obtained.

Alternatively, such a function may be implemented that High is outputted only in a period in which the signals in1 and in2 are High and Low respectively and signals in1 and in2 immediately before them are both High. As a result, timing charts shown in FIGS. 2C and 2D can be obtained.

It is needless to say that the relationship between the first and second signals may be opposite. High may be outputted only in a period in which the signals in2 and in1 are Low and High respectively and signals in1 and in2 immediately before them are both Low, or High may be outputted only in a period in which the signals in2 and in1 are High and Low respectively and the signals in1 and in2 immediately before them are both High. In that case, pulse is outputted when the signal in1 is delayed than the signal in2. No matter what the case might be, the delay relationship can be identified.

In order to obtain a digital signal, it is preferable to connect an output signal out to a latch circuit or a counter which are not in synchronization with the base clock. In FIGS. 2A to 2D, the output signal out has a shorter pulse width than the shortest period in which an input signal holds a value. Therefore, it is important that a circuit which is not in synchronization with the base clock is connected downstream of the output signal out in order to identify the short pulse.

According to the aforementioned connection, the input signal in2 is delayed than the input signal in1 in the case where a latch (the initial value is in a reset state) is not set or a value of the counter (the initial value is zero) is zero, and the input signal in1 is delayed than the input signal in2 in the case where the latch is set or the value of the counter is one or more. Note that the value of the counter corresponds to the number of pulse of the digital signal.

The timing charts shown in FIGS. 2B to 2D are just examples and not the only way to realize the delay identifying circuit of the invention. The invention provides a logic circuit which extracts a variation in delay of which time scale is shorter than the shortest period in which a signal holds a value into digital signals by using data of input signals and signals inputted before them.

In this manner, the delay identifying circuit of the invention is formed in which a variation in delay can be identified by digital signals.

The aforementioned delay identifying circuit identifies which of two signals is delayed than the other. In order to verify variations in delay on a chip-by-chip basis, it is preferable that delay time between signals can be evaluated quantitatively.

A logic circuit for evaluating a time difference between two digital signals quantitatively (hereinafter referred to as a delay time evaluating circuit) can be formed by the delay identifying circuit and a delay circuit which is capable of setting a delay time.

That is, the delay time evaluating circuit of the invention is inputted with first and second signals which are a pair of digital signals having a time difference, comprises a first delay circuit which is inputted with the first signal and outputs a fourth signal and capable of setting a delay time, a second delay circuit which is inputted with the second signal and output a fifth signal and capable of setting a delay time, and a delay identifying circuit which is inputted with the fourth and fifth signals, and outputs an output signal (third signal) of the delay identifying circuit.

FIGS. 3A and 3B show a block diagram and the operation of the delay time evaluating circuit of the invention. In FIG. 3A, a delay time evaluating circuit 304 comprises delay circuits 301 and 302, and a delay identifying circuit 303. The delay circuit 301 is capable of setting a delay time by a signal set1 and inputted with an input signal in1. Further, the delay circuit 302 is capable of setting a delay time by a signal set2 and inputted with a signal in2. Output signals of the delay circuits 301 and 302 are connected to the delay identifying circuit 303.

FIG. 3B shows a function of the circuit shown in FIG. 3A. In FIG. 3B, time $\delta$ is a delay time of the input signal in2 relatively to the input signal in1, time $\delta1$ is a delay time generated by the delay circuit 301, and time $\delta2$ is a delay time generated by the delay circuit 302. As shown in FIG. 3B, the delay time evaluating circuit outputs a pulse when $\delta1-\delta2>\delta$ is satisfied, whereas it does not output a pulse when $\delta1-\delta2<\delta$ is satisfied. Therefore, by switching the setting of $\delta1$ and $\delta2$ and identifying the presence of the pulse of the output signal out, the delay time $\delta$ can be evaluated.

Specifically, provided that setting values of the delay circuits 301 and 302 at the transition point that the output signal out generates a pulse are $\delta1^*$ and $\delta2^*$ respectively, the delay time $\delta$ can be evaluated as $\delta=\delta1^*-\delta2^*$.

As described above, the delay time evaluating circuit of the invention can be formed, and variations in delay which are shorter than the shortest period in which each signal holds a value can be evaluated quantitatively.

By incorporating the delay identifying circuit or the delay time evaluating circuit of the invention, variations in delay of internal signals of an integrated circuit can be evaluated. As a result, variations in delay can be verified on a chip-by-chip basis, which contributes to the improvement in characteristics of a chip by the improvement in design techniques.

By using the delay identifying circuit or the delay time evaluating circuit of the invention, optimal delay time can be evaluated efficiently in an integrated circuit which is capable of setting delay time of a clock signal and other control signals.

A logic circuit to which the invention is applied may be formed over a single crystalline silicon substrate, a glass substrate, or a plastic substrate. In particular, the invention is efficient when forming a logic circuit over a glass substrate or a plastic substrate of which variations in characteristics are large, a chip area is large, and variations in delay among signals are difficult to be estimated in the design phase.

By using the delay identifying circuit or the delay time evaluating circuit of the invention, a delay time which is shorter than the shortest period in which a signal holds a value can be evaluated quantitatively. As a result, variations in delay of a clock signal and other control signals can be verified on a chip-by-chip basis with high accuracy. Thus, actual measurement and simulation can be matched with higher accuracy, leading to achieve a more precise design and improvement in characteristics of a chip.

DETAILED DESCRIPTION OF THE INVENTION

This application is based on Japanese Patent Application serial no. 2003-284307 filed in Japan Patent Office on Jul. 31, 2003, the contents of which are hereby incorporated by reference.

Embodiment Mode 1

Figure 4A:
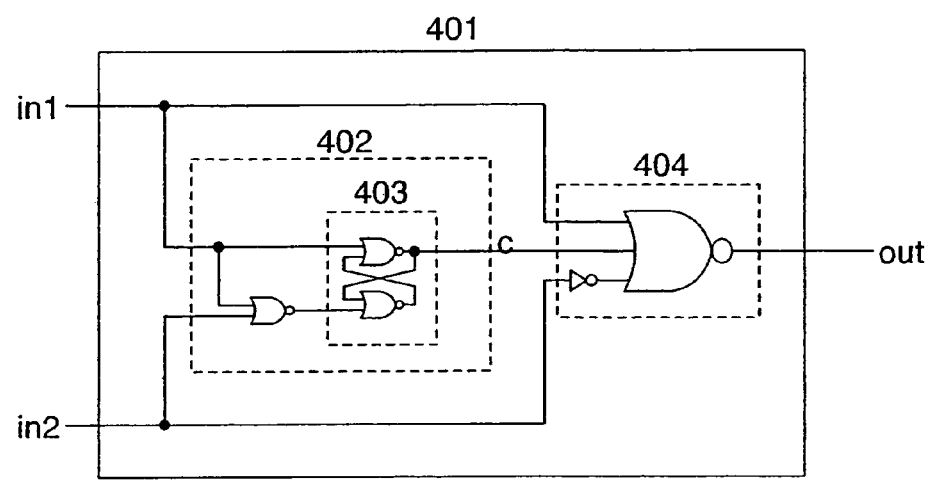
FIG. 4A is a block diagram of the delay identifying circuit of the invention and FIGS. 4B and 4C are timing charts thereof.

A typical circuit configuration and operation of the delay identifying circuit of the invention are described with reference to FIGS. 4A, 4B, and 4C. FIG. 4A is an example of a circuit configuration of the delay identifying circuit, in which a delay identifying circuit 401 comprises a logic circuit 402 including a latch circuit and a logic circuit 404. The logic circuit 402 including a latch circuit is formed by an RS latch circuit 403 using NOR gates and a NOR circuit having two inputs while the logic circuit 404 is formed by an inverter and a NOR circuit having three inputs.

Figure 4B:
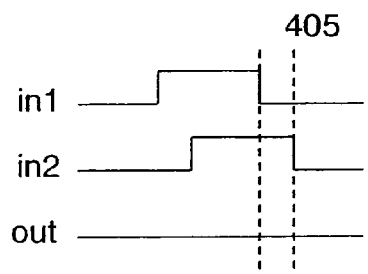
Figure 4C:
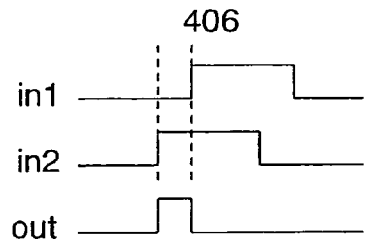

FIGS. 4B and 4C are timing charts. As shown, an output signal out outputs a pulse in the case where an input signal in2 is delayed than an input signal in1, and does not output a pulse in the case where the input signal in1 is delayed than the input signal in2.

The operation of the circuit shown in FIG. 4A is described briefly. According to the configuration of the logic circuit 404, the output signal out is High in the case where the signal in1 is Low and the signal in2 is High. That is, the output signal out is Low other than in a period 405 or 406 shown in FIGS. 4B and 4C. Further, the output signal out is High in the case where a signal c is Low in the period in which the signals in1 and in2 have different levels.

An output signal c of the logic circuit 402 including the RS latch circuit 403 is High in the case where the input signals in1 and in2 are both Low, and in the case where the input signal in1 is High. In other cases, a value is held as it is. In the timing charts shown in FIGS. 4B and 4C, the signal c is High during a period in which the signals in1 and in2 are both Low and during a period 406 in which the value is held.

As described above, the output signal out is High only in the period 406. Thus, the timing charts shown in FIGS. 4B and 4C can be obtained.

In the aforementioned operation, the latch circuit holds a value in the period 406. The value of an input signal immediately before the period 406 is reflected to the output signal c of the latch circuit.

Embodiment Mode 2

Figure 5A:
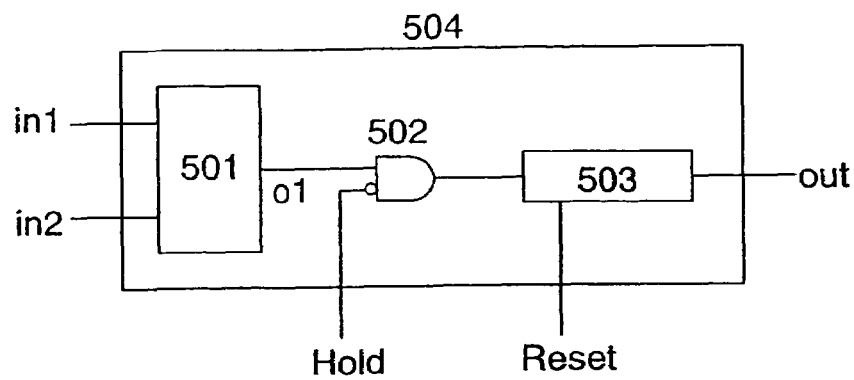
FIG. 5A is a block diagram of the delay identifying circuit of the invention and FIGS. 5B and 5C are timing charts thereof.

A typical configuration and operation of the delay identifying circuit of the invention are described with reference to FIGS. 5A, 5B, and 5C. A delay identifying circuit 504 shown in FIG. 5A comprises a delay identifying circuit 501 having signals in1 and in2 as inputs, a logic gate 502 which is inputted with an output (o1) of the delay identifying circuit 501 and a Hold signal, and a counter 503 connected to the output of the logic gate 502. A value of the counter 503 is outputted as an output signal out. Further, a Reset signal is inputted to the counter 503. According to this configuration, the output of the delay identifying circuit 501 is inputted to the counter 503 only when a Hold signal is Low so as to control a period to make comparison of signals. When a Reset signal is High, the counter 503 is reset to zero.

First, the counter 503 is reset to zero by a Reset signal in this circuit. After that, a Hold signal is set Low for a certain period (referred to as a sample period) in which the number of pulse outputted from the delay identifying circuit 501 is counted to make a comparison of delay of the input signals in1 and in2.

Figure 5B:
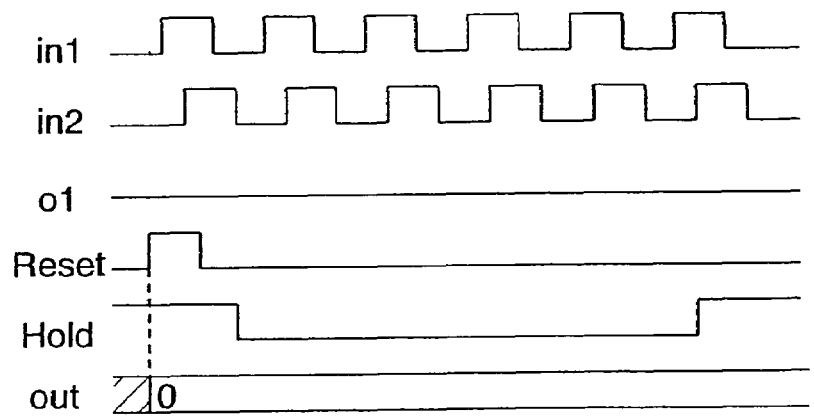
Figure 5C:
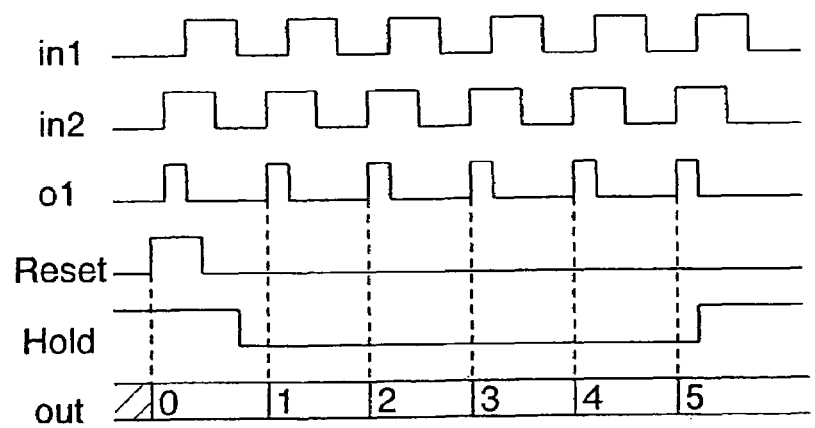

More specifically, a timing chart in which the input signal in2 is delayed than the input signal in1 is shown in FIG. 5B, while a timing chart in which the input signal in1 is delayed than the input signal in2 is shown in FIG. 5C.

In FIG. 5B, the input signal in2 is delayed than the input signal in1, therefore, the delay identifying circuit 501 does not output a pulse and a value of the counter 503 remains to be zero. In FIG. 5C, on the other hand, the input signal in1 is delayed than the input signal in2, therefore, the delay identifying circuit 501 outputs a pulse and the number of pulse of the signals inputted during a sample period is set in the counter 503. By reading out the value of the counter 503, a delay relationship of the input signals in1 and in2 can be identified as a digital signal.

Embodiment Mode 3

A typical configuration and a method for evaluation of the delay time evaluating circuit of the invention are described now. A delay time evaluating circuit 606 shown in FIG. 6 comprises delay circuits 601 and 602, a delay identifying circuit 603 shown in FIG. 1A, a logic gate 604, and a counter 605. The delay circuit 601 can set a delay time by a signal set1 and inputted with a signal in1. The delay circuit 602 can set a delay time by a signal set2 and inputted with a signal in2. The delay identifying circuit 603 is inputted with output signals of the delay circuits 601 and 602 and the logic gate 604 is inputted with an output signal of the delay identifying circuit 603 and a Hold signal. An output of the logic gate 604 and a Reset signal are connected to the counter 605. A value of the counter 605 is outputted as an output signal out.

Figure 6:
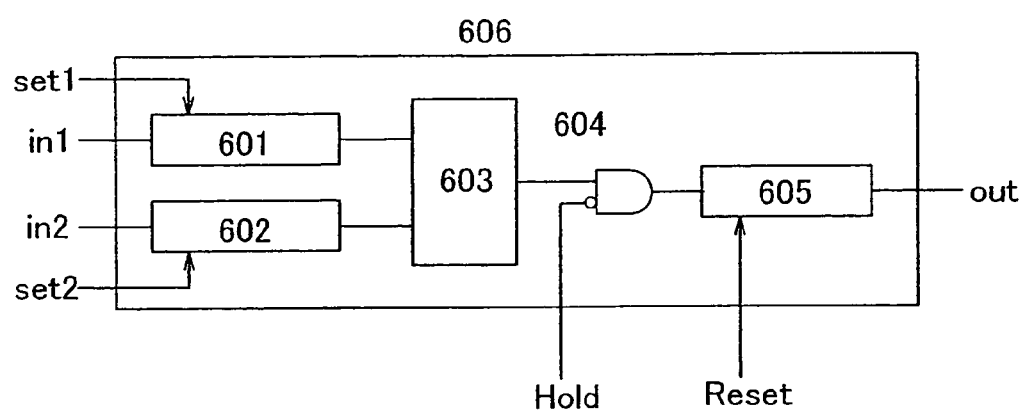
FIG. 6 is a block diagram of the delay time evaluating circuit of the invention.

A method of operation of the circuit shown in FIG. 6 is described. First, delay time of the delay circuits 601 and 602 are set as δ1 and δ2 respectively by using signals set1 and set2. The counter 605 is reset to zero by using a Reset signal. After that, a Hold signal is set Low for a certain period (referred to as a sample period) in which the number of pulse outputted from the delay identifying circuit 603 is counted to make a comparison of delay between signals in which the delay time δ1 and δ2 are added to the input signals in1 and in2 respectively.

For example, provided that a delay time of the signal in1 relatively to the signal in2 is δ, when δ2<δ+δ1 is satisfied, the number of pulse inputted in a sample period is set in the counter 605 similarly to the timing chart shown in FIG. 5C since an output signal of a delay circuit inputted with the signal in1 is delayed than an output signal of a delay circuit inputted with the signal in2. On the other hand, when δ2>δ+δ1 is satisfied, the value of the counter 605 remains to be zero similarly to the timing chart shown in FIG. 5B since the output signal of the delay circuit inputted with the signal in2 is delayed than the output signal of the delay circuit inputted with the input signal in1.

Therefore, by observing the transition point of the value of the counter 605 between zero or the number of pulse inputted in a sample period by changing the setting of δ1 and δ2, the delay time δ can be evaluated. In practice, when the delay time becomes almost as long as a delay time of a logic gate in the delay time evaluating circuit 606, the value of the counter 605 may have an intermediate value between zero and the number of pulse inputted in a sample period. For example, the smallest value δm of the counter 605 obtained by δ2−δ1, which is equal to or less than half of the number of pulse inputted in a sample period, and the largest value δM of the counter 605 obtained by δ2−δ1, which is equal to or more than the number of pulse inputted in a sample period are evaluated in order to evaluate the delay time δ of the signal in1 relatively to the signal in2 as δm<δ<δM.

In this manner, the delay time evaluating circuit of the invention can be formed, by which a fine variation in delay between input signals can be evaluated quantitatively.

Embodiment Mode 4

An integrated circuit which incorporates the delay time evaluating circuit of the invention and a method for evaluation of variations in delay are described.

As an integrated circuit, an integrated circuit formed by a clock generating circuit and a plurality of blocks is suggested, and an example to evaluate variations in delay between internal clock signals inputted between the adjacent blocks is described.

Figure 7:
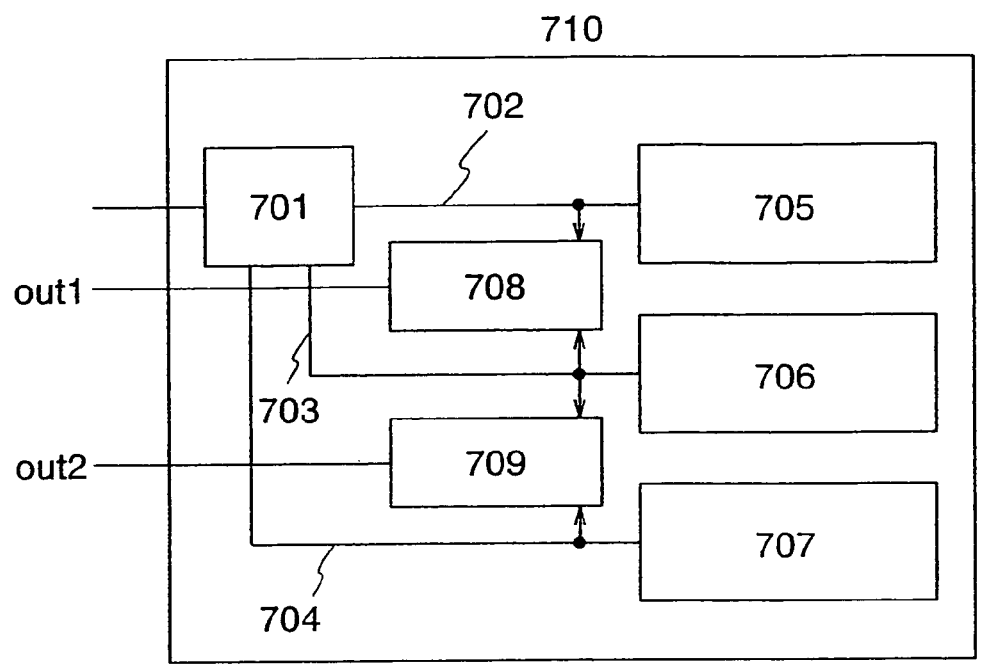
FIG. 7 is a block diagram of an integrated circuit which incorporates the delay time evaluating circuit of the invention.

A block diagram shown in FIG. 7 is one mode of an integrated circuit which incorporates the delay identifying circuit. In FIG. 7, an integrated circuit 710 comprises a clock generating circuit 701, blocks 705, 706, and 707, and a delay time evaluating circuits 708 and 709. The blocks 705, 706, and 707 are supplied with internal clock signals 702, 703, and 704 generated in the clock generating circuit 701 respectively. Further, the delay time evaluating circuits 708 and 709 are inputted with internal clock signals 702 and 703, and internal clock signals 703 and 704 respectively and an output signals can be obtained outside of the chip.

By the aforementioned configuration, a variation in delay between internal clock signals supplied to the blocks 705 and 706 can be evaluated by the delay time evaluating circuit 708, and a variation in delay between internal clock signals supplied to the blocks 706 and 707 can be evaluated by the delay time evaluating circuit 709 respectively.

By evaluating a variation in delay between internal clock signals in this manner, variations in delay between signals can be verified on a chip-by-chip basis and more precise design can be achieved.

Hereinafter described are embodiments of the invention.

Embodiment 1

In this embodiment, a complementary circuit configuration is described as another configuration example of the delay identifying circuit and the delay time evaluating circuit of the invention.

Figure 8A:
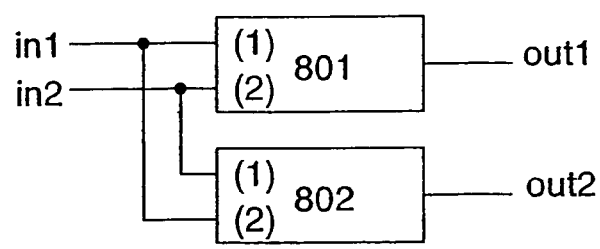
FIGS. 8A and 8B are block diagrams of the delay identifying circuit and the delay time evaluating circuit of the invention respectively.

FIG. 8A shows an example of using two of the delay identifying circuit or the delay time evaluating circuit shown in FIG. 1A, 3A, 5A, or 6 and two sets of output signals are generated by switching input signals with each other.

Figure 1A:
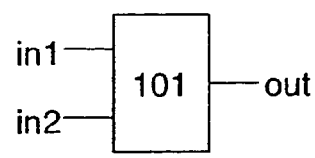
FIG. 1A is a block diagram of the delay identifying circuit of the invention and FIGS. 1B to 1E are diagrams showing the operation thereof.
Figure 1B:
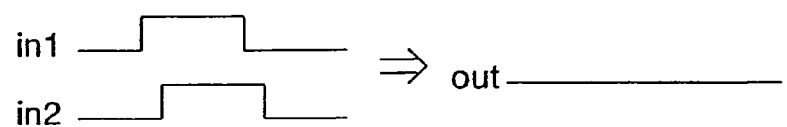
Figure 1C:
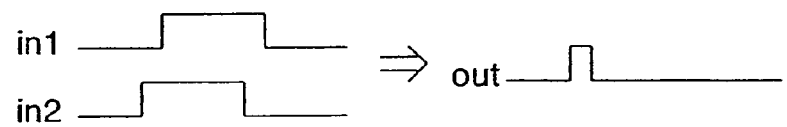
Figure 1D:
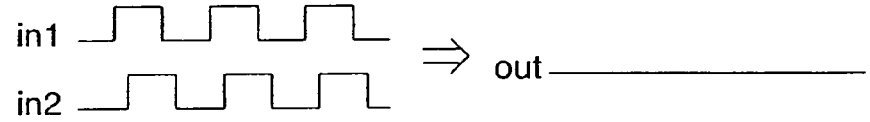
Figure 1E:
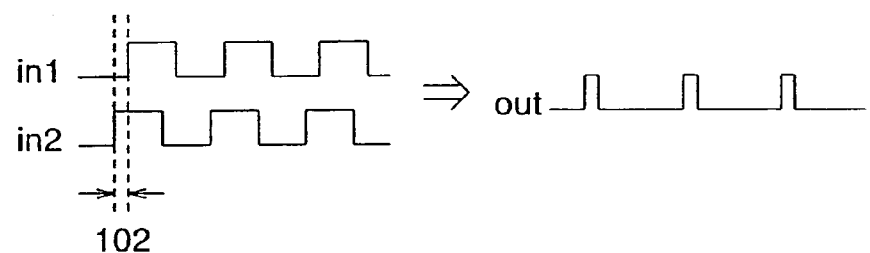
Figure 2A:
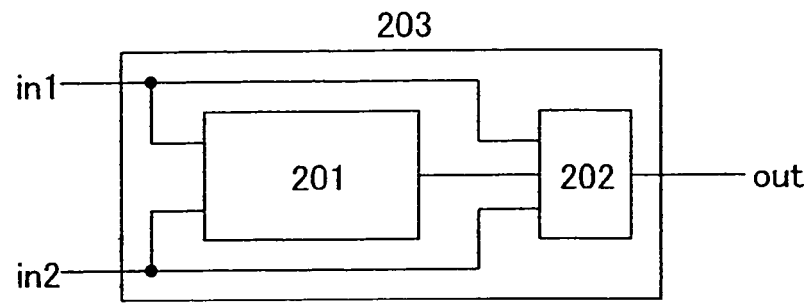
FIG. 2A is a block diagram of the delay identifying circuit of the invention and FIGS. 2B to 2D are timing charts thereof.
Figure 2B:
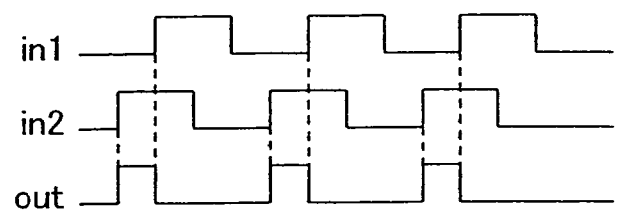
Figure 2C:
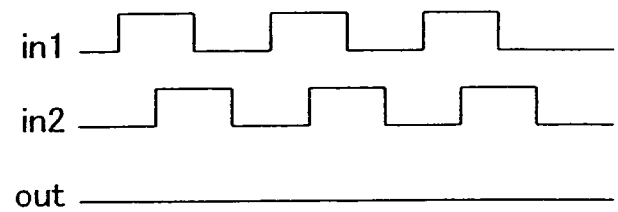
Figure 2D:
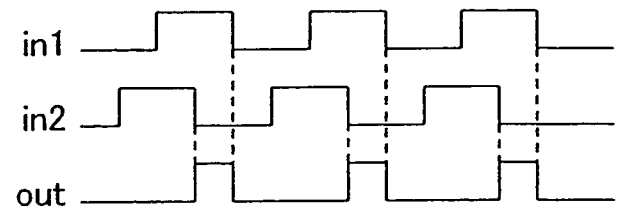

When using the circuit shown in FIG. 1A as circuits 801 and 802, for example, the signal in1 is delayed than the signal in2 in the case where only the signal out1 generates a pulse, and the signal in2 is delayed than the signal in1 in the case where only the signal out2 generates a pulse.

Further, in the case where both of the signals out1 and out2 do not generate a pulse or the case where both generate pulses, it can be assumed that the delay of the signal in1 relatively to the signal in2 is as long as the delay time of logic gates configuring the circuits 801 and 802. Thus, more accurate evaluation can be performed as compared to the case of using only one circuit.

Figure 8B:
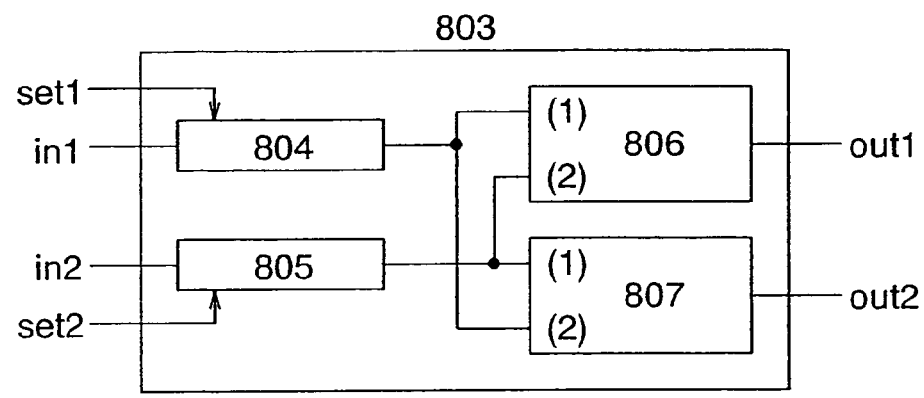

FIG. 8B shows another configuration example which implements a complementary function which is different than FIG. 8A. In FIG. 8B, a delay time evaluating circuit 803 is formed by delay circuits 804 and 805, and delay identifying circuits 806 and 807. The circuits shown in FIG. 1A or 5A can be used as the delay identifying circuits 806 and 807. It should be noted that a delay circuit to input the same signals is shared by the delay identifying circuits in this configuration example, compared with the case using FIGS. 3A and 6 as circuits 81 and 802 in FIG. 8A.

Embodiment 2

In this embodiment, an example of a delay circuit which is capable of setting a delay time is described with reference to FIGS. 9 and 10.

Figure 9:
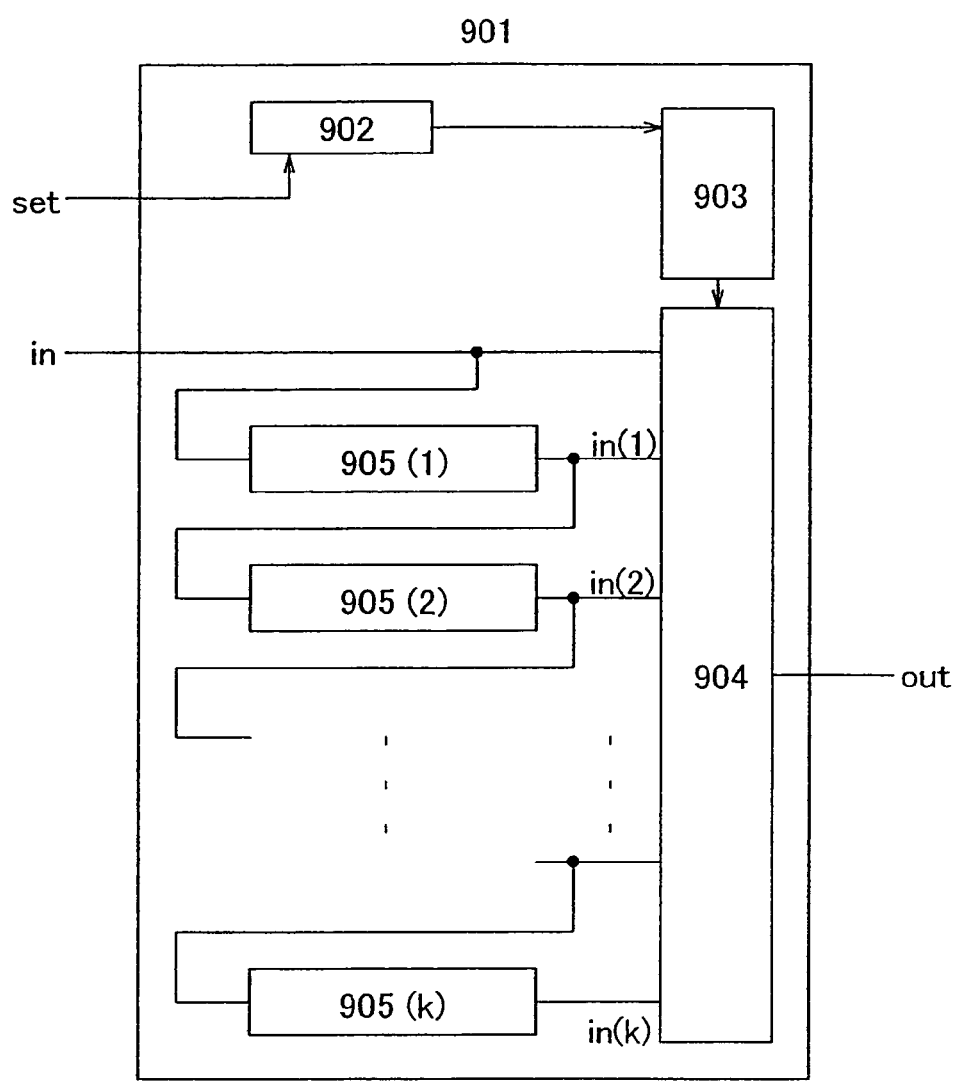
FIG. 9 is a block diagram of the delay circuit of the invention which is capable of setting a delay time.

A delay circuit 901 which is capable of setting a delay time shown in FIG. 9 comprises a register 902, a decoder 903, a selector 904, and delay units 905(1) to 905(k) (k is a positive integer). The delay units 905(1) to 905(k) are circuits which delay signals by delay time δ(1) to δ(k) respectively, and can be formed by an inverter chain and the like, for example. The delay units 905(1) to 905(k) are connected in series to an input signal in, in this order. The input signal in and signals in(1) to in(k) which are output signals of the delay units 905(1) to 905(k) respectively are inputted to the selector 904.

The operation of the delay circuit 901 which is capable of setting a delay time shown in FIG. 9 is described. First, the register 902 is set by a set signal and the value thereof is inputted to the decoder 903. The decoder 903 decodes an input signal from the register 902, and one of the plurality of signals in and in(1) to in(k) having different levels of delay is connected to a signal out by the selector 904 according to the output of the decoder 903.

In this manner, a delay circuit which is capable of selecting a delay time by a register can be formed.

Figure 10:
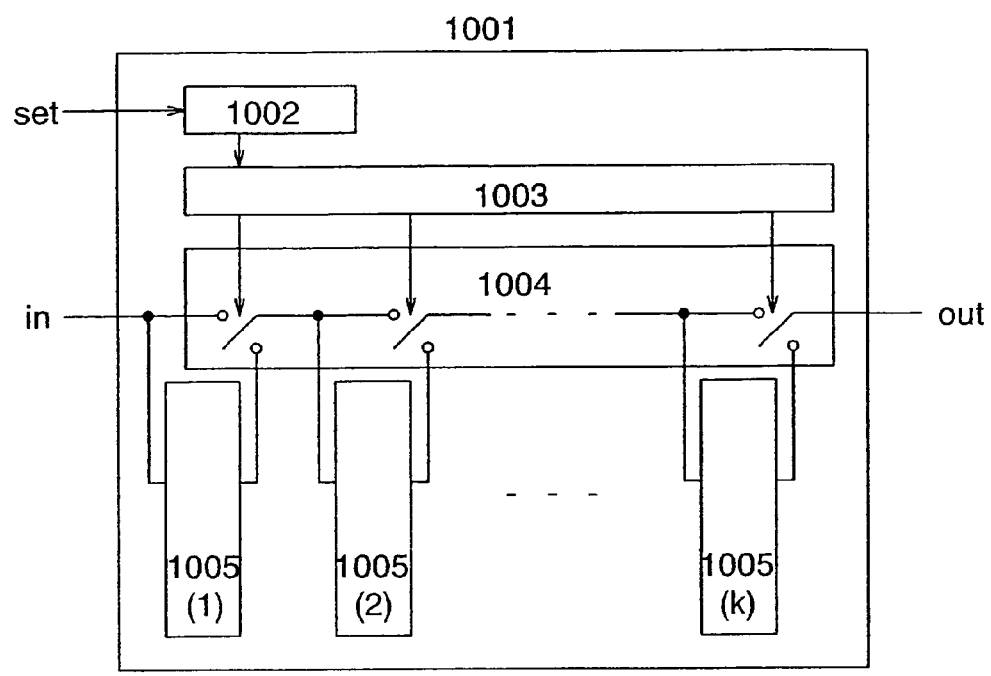
FIG. 10 is a block diagram of the delay circuit of the invention which is capable of setting a delay time.

FIG. 10 shows a delay circuit which is capable of setting a delay time and has a different configuration than FIG. 9. A delay circuit 1001 which is capable of setting a delay time shown in FIG. 10 comprises a register 1002, a decoder 1003, a selector 1004, and delay units 1005(1) to 1005(k). The delay units 1005(1) to 1005(k) are circuits which delay signals by delay time δ(1) to δ(k) respectively, and can be formed by an inverter chain and the like, for example. The delay units selected by the selector 1004 are connected in series between the input signal in and the output signal out.

As a result, a delay circuit can be formed which delays by a sum of delay time of the delay units selected by a register.

Embodiment 3

In this embodiment, a method of evaluation of variations of delay time generated by a delay circuit is described. By using a configuration of this embodiment, delay time between input signals can be evaluated with high accuracy without being affected by the variations of delay circuit.

Figure 3A:
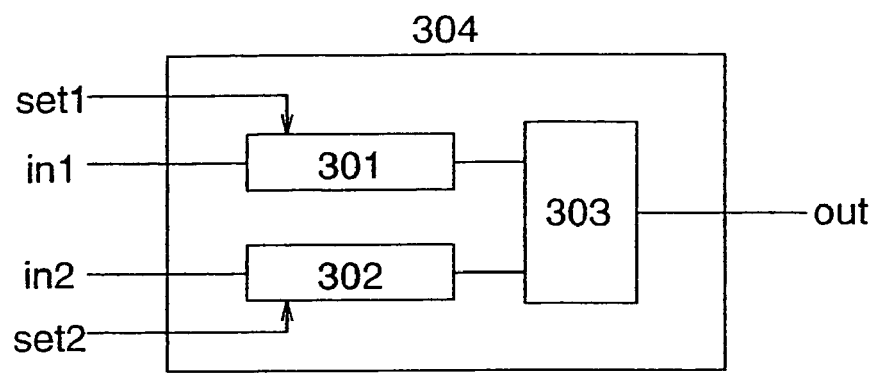
FIG. 3A is a block diagram of the delay time evaluating circuit of the invention and FIG. 3B is a timing chart thereof.
Figure 3B:
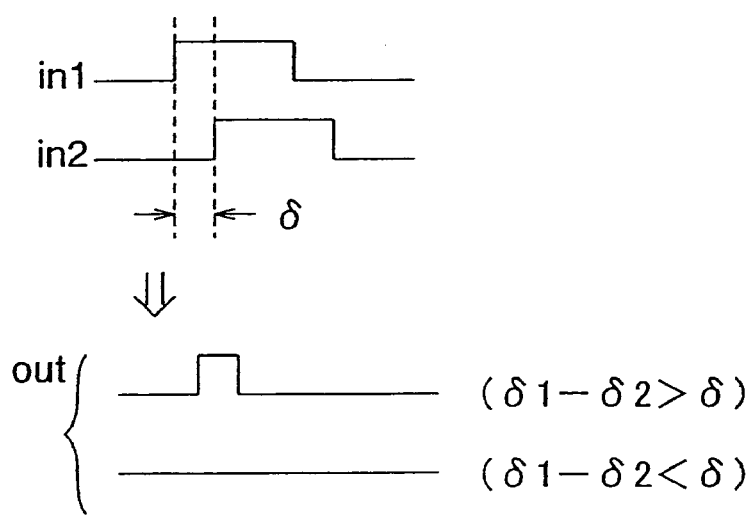
Figure 11:
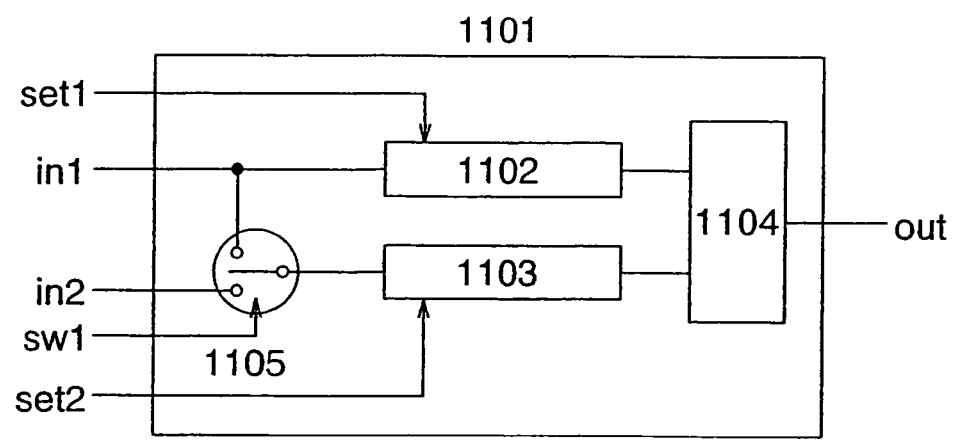
FIG. 11 is a block diagram of the delay time evaluating circuit of the invention.

FIG. 11 shows an example of a block diagram of such delay time evaluating circuit, which is the delay time evaluating circuit shown in FIG. 3 having a switch 1105 additionally so that signals having no time difference can be inputted to two delay circuits.

A delay time of a delay circuit 1102 and a delay time of a delay circuit 1103 can be comparatively evaluated by inputting signals in1 having no time difference to the delay circuits 1102 and 1103 by using a signal line sw1 and identifying the delay relationship between the signals inputted to a delay identifying circuit 1104.

Then, by removing the effect of a variation of the delay circuits 1102 and 1103 from the delay time of the signals in1 and in2 which are evaluated by using the delay time evaluating circuit 1101, highly accurate evaluation can be carried out.

Described in this embodiment is a configuration example based on FIG. 3A, however, the delay time evaluating circuit having another configuration can function similarly to this embodiment as well.

Embodiment 4

A delay identification and delay time evaluation among digital signals can be carried out with the irregular digital signals as well as clock signals.

Figure 12A:
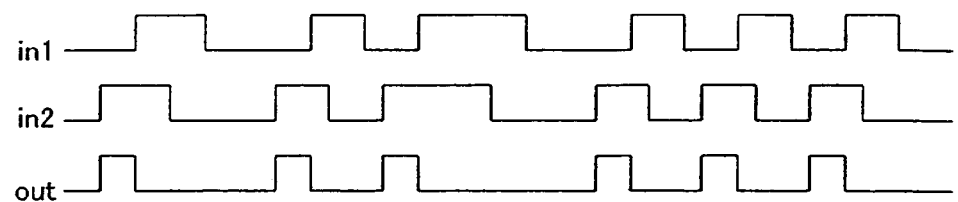
FIGS. 12A and 12B are timing charts of the delay identifying circuit of the invention.
Figure 12B:
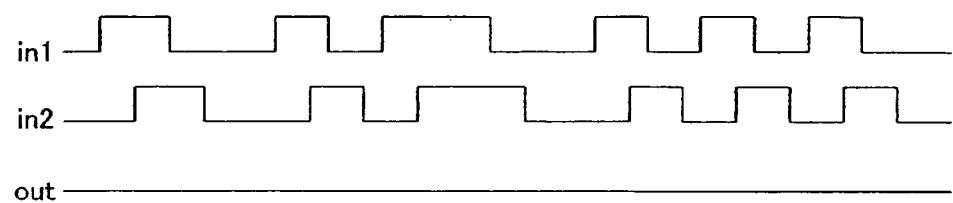

For example, when irregular digital signals as shown by signals in1 and in2 of FIGS. 12A and 12B are inputted to the delay identifying circuit (for example FIG. 3A), signals out shown in FIGS. 12A and 12B are outputted respectively. Therefore, the irregular signals can be evaluated just like clock signals with regard to the existence of a pulse and the number of pulse.

Embodiment 5

An example of using a CPU as an integrated circuit which incorporates the delay identifying circuit and the delay time evaluating circuit of the invention is described.

Figure 13A:
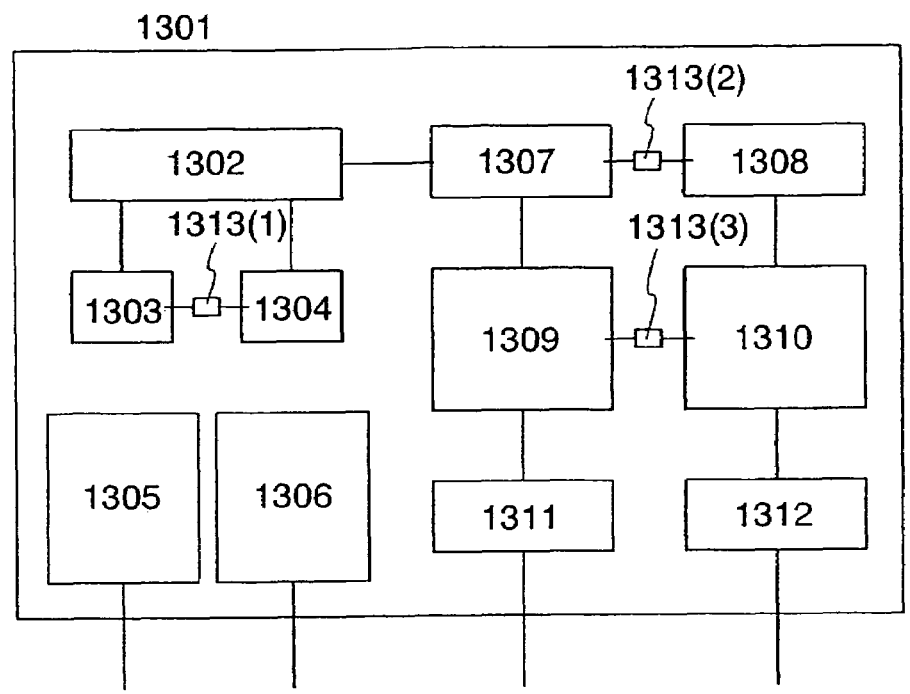
FIGS. 13A and 13B are block diagrams of a CPU which incorporates the delay time evaluating circuit of the invention.

A CPU having blocks as shown in FIG. 13A can be suggested as an example. In FIG. 13A, a CPU 1301 comprises a general register 1302, an ALU 1303, an FPU 1304, a load/store unit 1307, a conditional branch unit 1308, a data control unit 1309, an instruction analysis unit 1310, an interrupt control unit 1305, a clock control unit 1306, a data bus I/F 1311, an address bus I/F 1312 and the like.

In FIG. 13A, the blocks 1313(1) to 1313(3) are the delay identifying circuits or the delay time evaluating circuits of the invention which are inputted with clock signals (or corresponding control signals) of different blocks. FIG. 13A shows only an example and delay among signals can generally be compared by incorporating the delay identifying circuit or the delay time evaluating circuit of the invention in an integrated circuit with signal lines as inputs, of which delay relationship is to be evaluated.

Figure 13B:
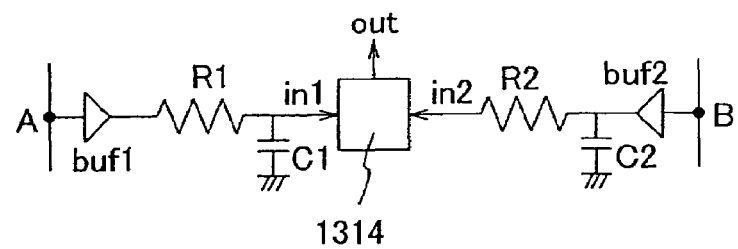

In the case of incorporating the delay identifying circuit of the invention, it is important to suppress the difference between delay time which is generated until two signals to be compared are inputted to the delay identifying circuit. Specifically, it is preferable that the two points to be compared are as close as possible on a layout. It is also preferable to thicken the wirings between each of the two points and the delay identifying circuit, widen the space between the wirings, and the like in order to suppress resistance and capacitance. In the case where there is a space between the wirings, it is preferable to derive a signal through buffers buf1 and buf2, dispose a delay comparison circuit 1314 near the center between two points A and B, and perform the layout so that resistance R1 and R2, and capacitance C1 and C2 due to lead wirings become almost the same as shown in FIG. 13B.

It should be noted that a CPU is employed as an integrated circuit as an example in this embodiment, however, it is needless to say that the invention can be applied to other integrated circuits as well. The invention can be applied to a functional circuit such as an image processing circuit and an audio processing circuit depending on application, a memory, or a driver circuit of a display or the like.

Embodiment 6

Electronic apparatuses using the delay identifying circuit of the invention include a video camera, a digital camera, a goggle type display (head mounted display), a navigation system, an audio reproduction apparatus (a car audio, an audio component system and the like), a notebook type personal computer, a game machine, a portable information terminal (a mobile computer, a portable phone, a portable game machine, an electronic book and the like), an image reproduction apparatus provided with a recording medium (specifically, apparatus provided with a display device capable of reproducing the recording medium such as a Digital Versatile Disk (DVD), etc. and displaying the image thereof), and the like. Specific examples of these electronic apparatuses are shown in FIGS. 14A to 14E.

Figure 14A:
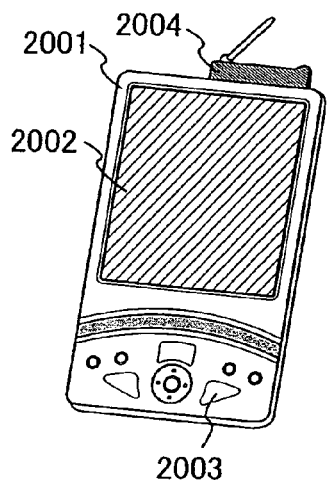
FIGS. 14A to 14E are views of electronic apparatuses as examples using the delay identifying circuit of the invention.

FIG. 14A illustrates a portable information terminal including a body 2001, a display portion 2002, an operating key 2003, a modem 2004 and the like. FIG. 14A illustrates the portable information terminal of which modem 2004 is detachable, however, it may be incorporated in the body 2001. By incorporating the delay identifying circuit of the invention in a signal processing circuit in the portable information terminal, variations in delay of internal clock signals can be considered with high accuracy in the design phase, which leads to improve the yield.

Figure 14B:
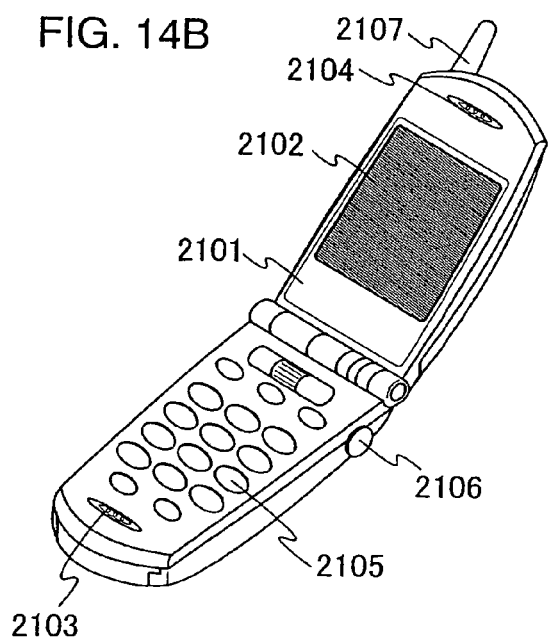

FIG. 14B illustrates a portable phone including a body 2101, a display portion 2102, an audio input portion 2103, an audio output portion 2104, an operating key 2105, an external connecting port 2106, an antenna 2107, and the like. The current consumption of the portable phone can be suppressed by displaying white text on a black background in the display portion 2102. By incorporating the delay identifying circuit of the invention in a signal processing circuit in the portable phone, variations in delay of internal clock signals can be considered with high accuracy in the design phase, which leads to improve the yield.

Figure 14C:
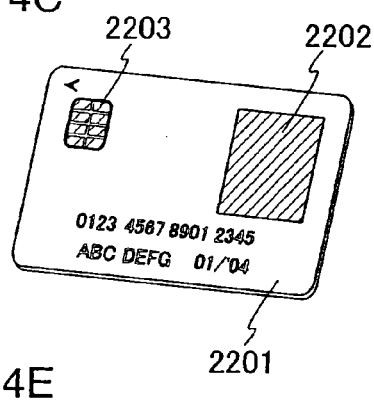

FIG. 14C illustrates an electronic card including a body 2201, a display portion 2202, a connecting terminal 2203, and the like. By incorporating the delay identifying circuit of the invention in a signal processing circuit in the electronic card, variations in delay of internal clock signals can be considered with high accuracy in the design phase, which leads to improve the yield. FIG. 14C illustrates a contact type electronic card, however, the semiconductor integrated circuit of the invention can be used in an non-contact type electronic card or an electronic card operating both with and without contact.

Figure 14D:
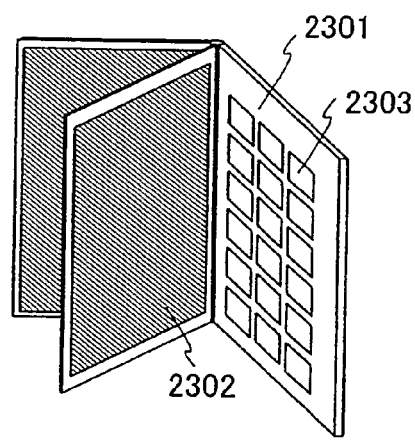

FIG. 14D illustrates an electronic book including a body 2301, a display portion 2302, an operating key 2303, and the like. A modem may be incorporated in the body 2301 as well. By incorporating the delay identifying circuit of the invention in a signal processing circuit in the electronic book, variations in delay of internal clock signals can be considered with high accuracy in the design phase, which leads to improve the yield.

Figure 14E:
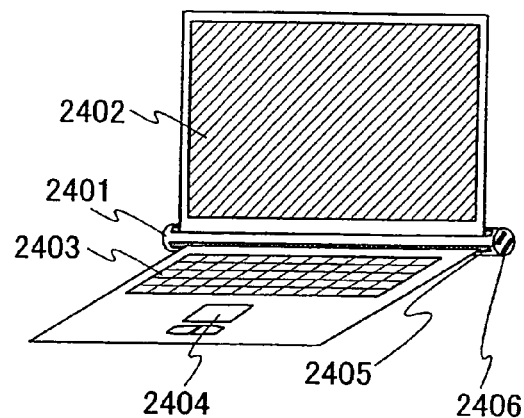

FIG. 14E illustrates a personal computer including a body 2401, a display portion 2402, a keyboard 2403, a touch pad 2404, an external connecting port 2405, a power supply plug 2406 and the like. By incorporating the delay identifying circuit of the invention in a signal processing circuit in a sheet type personal computer, variations in delay of internal clock signals can be considered with high accuracy in the design phase, which leads to improve the yield.

As described above, application range of the invention is quite wide, and the invention can be used in various fields of electronic apparatuses. Note that the electronic apparatuses described in this embodiment can be implemented in combination with any of the configurations described in Embodiments 1 to 5.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:
1. A semiconductor device comprising:
a delay identifying circuit, which is inputted with a first signal and a second signal, and generates a third signal having a different number of pulses between in the case where the first signal is delayed than the second signal and in the case where the second signal is delayed than the first signal;
a logic circuit, which is inputted with the third signal and a fourth signal, and outputs a fifth signal; and
a counter, which is inputted with the fifth signal and a sixth signal, and output a seventh signal,
wherein the logic circuit is controlled with the fourth signal which determines a period in which the number of pulses of the third signal is counted, and the counter is reset with the sixth signal.

2. The semiconductor device according to claim 1, wherein the first signal and the second signal are digital signals.

3. The semiconductor device according to claim 1, wherein the semiconductor device is formed over a silicon substrate.

4. The semiconductor device according to claim 1, wherein the semiconductor device is formed over a glass substrate.

5. The semiconductor device according to claim 1, wherein the semiconductor device is formed over a plastic substrate.

6. An electronic apparatus having the semiconductor device according to claim 1, wherein the electronic apparatus is selected from the group consisting of a video camera, a digital camera, a goggle type display, a navigation system, an audio reproduction apparatus, a notebook type personal computer, a game machine, a portable information terminal and an image reproduction apparatus.

7. A semiconductor device comprising:
a first delay circuit, which is inputted with a first signal and is capable of setting a delay time by using a third signal to output a fifth signal;
a second delay circuit, which is inputted with a second signal and is capable of setting a delay time by using a fourth signal to output a sixth signal;
a delay identifying circuit, which is inputted with a fifth signal and a sixth signal, and generates a seventh signal having a different number of pulses between in the case where the fifth signal is delayed than the sixth signal and in the case where the sixth signal is delayed than the fifth signal;
a logic circuit, which is inputted with the seventh signal and a eighth signal, and outputs a ninth signal; and
a counter, which is inputted with the ninth signal and a tenth signal, and output an eleventh signal,
wherein the logic circuit is controlled with the eighth signal which determines a period in which the number of pulses of the seventh signal is counted, and the counter is reset with the tenth signal.

8. The semiconductor device according to claim 7, wherein the first signal and the second signal are digital signals.

9. The semiconductor device according to claim 7, wherein the semiconductor device is formed over a silicon substrate.

10. The semiconductor device according to claim 7, wherein the semiconductor device is formed over a glass substrate.

11. The semiconductor device according to claim 7, wherein the semiconductor device is formed over a plastic substrate.

12. An electronic apparatus having the semiconductor device according to claim 7, wherein the electronic apparatus is selected from the group consisting of a video camera, a digital camera, a goggle type display, a navigation system, an audio reproduction apparatus, a notebook type personal computer, a game machine, a portable information terminal and an image reproduction apparatus.

13. A semiconductor device comprising:
a first input terminal, which is inputted with a first signal;
a second input terminal, which is inputted with a second signal;
a first logic circuit connected to the first input terminal and the second input terminal, and comprising a memory circuit which is in a holding state either in a period in which the first signal is Low and the second signal is High, or a period in which the first signal is High and the second signal is Low; and
a second logic circuit, which is inputted with the first signal, the second signal, and an output signal of the first logic circuit, and generates a third signal having different number of pulse between in the case where the first signal is delayed than the second signal and in the case where the second signal is delayed than the first signal.

14. The semiconductor device according to claim 13,
wherein in one of the case where the first signal is delayed than the second signal and the case where the second signal is delayed than the first signal, the third signal has as many pulse as the first signal or the second signal does, and
wherein in the other case, the third signal does not have a pulse.

15. The semiconductor device according to claim 13, wherein the time difference is equal to or shorter than a period in which the first signal or the second signal holds a value.

16. The semiconductor device according to claim 13,
wherein the first signal and the second signal are in synchronization with a clock signal, and
wherein the time difference is equal to or less than a half cycle of the clock signal.

17. An electronic apparatus having the semiconductor device according to claim 13, wherein the electronic apparatus is selected from the group consisting of a video camera, a digital camera, a goggle type display, a navigation system, an audio reproduction apparatus, a notebook type personal computer, a game machine, a portable information terminal and an image reproduction apparatus.

18. A semiconductor device comprising:
a first input terminal, which is inputted with a first signal;
a second input terminal, which is inputted with a second signal;
a first delay circuit connected to the first input terminal, wherein the first delay circuit is inputted with the first signal and a sixth signal, and is capable of setting a delay time by using the sixth signal to output a fourth signal;
a second delay circuit connected to the second input terminal, wherein the second delay circuit is inputted with the second signal and a seventh signal, and is capable of setting a delay time by using the seventh signal to output a fifth signal; and
a logic circuit, which is inputted with the fourth signal and the fifth signal and generates a third signal.

19. An electronic apparatus having the semiconductor device according to claim 18, wherein the electronic apparatus is selected from the group consisting of a video camera, a digital camera, a goggle type display, a navigation system, an audio reproduction apparatus, a notebook type personal computer, a game machine, a portable information terminal and an image reproduction apparatus.

20. A semiconductor device comprising:
a first input terminal, which is inputted with a first signal;
a second input terminal, which is inputted with a second signal;
a first delay circuit connected to the first input terminal, wherein the first delay circuit is inputted with the first signal and is capable of setting a delay time to output a fourth signal;
a second delay circuit connected to the second input terminal, wherein the second delay circuit is inputted with the second signal and is capable of setting a delay time to output a fifth signal;
a first logic circuit inputted with the fourth signal and the fifth signal, and comprising a memory circuit which is in a holding state either in a period in which the fourth signal is Low and the fifth signal is High, or a period in which the fourth signal is High and the fifth signal is Low; and
a second logic circuit, which is inputted with the fourth signal, the fifth signal, and an output signal of the first logic circuit, and generates a third signal having different number of pulse between in the case where the fourth signal is delayed than the fifth signal and in the case where the fifth signal is delayed than the fourth signal.

21. The semiconductor device according to claim 20,
wherein in one of the case where the fourth signal is delayed than the fifth signal and the case where the fifth signal is delayed than the fourth signal, the third signal has as many pulse as the fourth signal or the fifth signal does, and
wherein in the other case, the third signal does not have a pulse.

22. The semiconductor device according to claim 20, wherein the time difference is equal to or shorter than a period in which the first signal or the second signal holds a value.

23. The semiconductor device according to claim 20,
wherein the first signal and the second signal are in synchronization with a clock signal, and
wherein the time difference is equal to or less than a half cycle of the clock signal.

24. An electronic apparatus having the semiconductor device according to claim 20, wherein the electronic apparatus is selected from the group consisting of a video camera, a digital camera, a goggle type display, a navigation system, an audio reproduction apparatus, a notebook type personal computer, a game machine, a portable information terminal and an image reproduction apparatus.

* * * * *